US008580592B2

(12) United States Patent
Sakurai

(10) Patent No.: US 8,580,592 B2
(45) Date of Patent: Nov. 12, 2013

(54) METHOD FOR MANUFACTURING SEMICONDUCTOR LIGHT EMITTING ELEMENT, AND SEMICONDUCTOR LIGHT EMITTING ELEMENT

(75) Inventor: Tetsuo Sakurai, Ichihara (JP)

(73) Assignee: Toyoda Gosei Co., Ltd., Aichi (JP)

( * ) Notice: Subject to any disclaimer, the term of this patent is extended or adjusted under 35 U.S.C. 154(b) by 199 days.

(21) Appl. No.: 13/142,143

(22) PCT Filed: Dec. 17, 2009

(86) PCT No.: PCT/JP2009/071023
§ 371 (c)(1),
(2), (4) Date: Jun. 24, 2011

(87) PCT Pub. No.: WO2010/073957
PCT Pub. Date: Jul. 1, 2010

(65) Prior Publication Data
US 2011/0260177 A1    Oct. 27, 2011

(30) Foreign Application Priority Data

Dec. 26, 2008   (JP) .................................. 2008-334869

(51) Int. Cl.
  *H01L 21/00*    (2006.01)
(52) U.S. Cl.
  USPC .................................. 438/46; 257/79; 438/22
(58) Field of Classification Search
  USPC ........ 257/E21.53, 79; 438/46, 22, 29, 31, 42, 438/43.01; 372/43.01
  See application file for complete search history.

(56) References Cited

U.S. PATENT DOCUMENTS

| 6,829,270 B2 * | 12/2004 | Suzuki et al. ............. 372/43.01 |
| 2009/0117675 A1 | 5/2009 | Yamanaka et al. |
| 2010/0065855 A1 | 3/2010 | Yokoyama et al. |

FOREIGN PATENT DOCUMENTS

| JP | 2000-100728 A | 4/2000 |
| JP | 2004-168622 A | 6/2004 |
| JP | 2006-156454 A | 6/2006 |
| JP | 2007-184352 A | 7/2007 |
| JP | 2008-177525 A | 7/2008 |
| JP | 2008-294449 A | 12/2008 |
| TW | 558846 B | 10/2003 |
| TW | 200807749 A | 2/2008 |

OTHER PUBLICATIONS

Machine translation of JP 2006-156454.*

* cited by examiner

*Primary Examiner* — Julio J Maldonado
*Assistant Examiner* — Robert Bachner
(74) *Attorney, Agent, or Firm* — Sughrue Mion, PLLC

(57) ABSTRACT

Provided is a method for manufacturing a semiconductor light emitting element, which has a step wherein a substrate composed of a material different from that of a semiconductor layer is used and a III compound semiconductor layer is formed on the substrate, and can reduce the emission wavelength distribution (δ) of the obtained semiconductor light emitting layer. The method for manufacturing the semiconductor light emitting element having the III compound semiconductor layer is characterized in having: a compound semiconductor substrate forming step wherein at least one compound semiconductor layer is formed on the substrate and a compound semiconductor substrate having an amount of warpage (H) within the range of 50 μm≤H≤250 μm is formed; and a light emitting layer forming step wherein the light emitting layer composed of a plurality of III compound semiconductor layers is formed on the compound semiconductor substrate which has been formed.

10 Claims, 2 Drawing Sheets

METHOD FOR MANUFACTURING SEMICONDUCTOR LIGHT EMITTING ELEMENT, AND SEMICONDUCTOR LIGHT EMITTING ELEMENT

CROSS REFERENCE TO RELATED APPLICATIONS

This application is a National Stage of International Application No. PCT/JP2009/071023 filed Dec. 17, 2009, claiming priority based on Japanese Patent Application No. 2008-334869, filed Dec. 26, 2001, the contents of all of which are incorporated herein by reference in their entirety.

TECHNICAL FIELD

The present invention relates to a method for manufacturing a semiconductor light emitting element or the like, and in particular to a method for manufacturing a semiconductor light emitting element having a group III compound semiconductor layer or the like.

BACKGROUND ART

In general, the semiconductor light emitting element having a compound semiconductor layer such as a group III-V compound semiconductor layer is prepared as a light emitting element chip by forming the compound semiconductor layer on a substrate made of a sapphire single crystal or the like, further providing an anode, a cathode and the like, grinding and polishing a surface-to-be-ground of the substrate, and thereafter cutting into an appropriate shape (refer to Patent Document 1).

CITATION LIST

Patent Literature

Patent Document 1: Japanese Patent Laid-Open Publication No. 2008-177525

DISCLOSURE OF INVENTION

Technical Problem

Incidentally, there is a problem that, when a substrate made of a material different from a compound semiconductor constituting a semiconductor layer is used and a compound semiconductor layer is formed on the substrate, a standard deviation σ of the wavelength distribution (in this specification, also referred to as an emission wavelength distribution a (nm)) of the obtained compound semiconductor light emitting layer becomes large. Such a tendency is increasing particularly in the case of forming the compound semiconductor layer by MOCVD (ORGANIC METAL CHEMICAL VAPOUR DEPOSITION).

It is considered to be mainly caused by a warpage generated in the substrate due to a difference in a coefficient of thermal expansion between the substrate and the compound semiconductor. If the warpage occurs in the substrate, a temperature distribution occurs on the substrate in the case of forming the compound semiconductor layer by MOCVD, and thereby, for example, a distribution of an element such as In (indium) becomes nonuniform. Accordingly, when light emitting elements are manufactured by the compound semiconductor layers, some light emitting elements having undesirable wavelength are produced in a substrate, thus causing a problem that yields of the products from one substrate are reduced.

An object of the present invention is to provide a method for manufacturing a compound semiconductor light emitting element including a step of, by use of a substrate made of a material different from that constituting a compound semiconductor layer, forming a group III compound semiconductor layer on the substrate, which enables to reduce an emission wavelength distribution σ of the obtained compound semiconductor light emitting layer.

Solution to Problem

According to the present invention, there is provided a method for manufacturing a semiconductor light emitting element having a group III compound semiconductor layer (also referred to as a compound semiconductor light emitting element), the method including: a compound semiconductor substrate forming step that forms at least one compound semiconductor layer on a substrate to form a compound semiconductor substrate having an amount of warpage H within a range of 50 μm≤H≤250 μm; and a light emitting layer forming step that forms a light emitting layer composed of plural group III compound semiconductor layers on the compound semiconductor substrate having been formed.

Here, in the method for manufacturing a semiconductor light emitting element to which the present invention is applied, it is preferable that the group III compound semiconductor layer formed on the substrate contains at least a group III nitride.

It is also preferable that the diameter D of the substrate is selected from a range of 50 mm to 155 mm.

Further, it is preferable that the thickness d of the substrate is selected from a range of 0.4 mm to 1.5 mm.

Furthermore, it is preferable that an amount of warpage H of the substrate is selected from a range of −10 μm≤H≤10 μm.

Next, in the method for manufacturing a semiconductor light emitting element to which the present invention is applied, it is preferable that the amount of warpage H of the compound semiconductor substrate is selected from a range of 100 μm≤H≤115 μm.

Further, it is preferable that the substrate is made of a material different from a material of a group III compound semiconductor layer.

Furthermore, in the method for manufacturing a semiconductor light emitting element to which the present invention is applied, it is preferable that the substrate is made of sapphire.

Moreover, it is preferable that an intermediate layer forming step that forms an intermediate layer containing aluminum nitride compound in advance is included.

Further, it is preferable that the intermediate layer is formed on the substrate by sputtering.

Furthermore, according to the present invention, there is provided a semiconductor light emitting element manufactured by the aforementioned methods for manufacturing a semiconductor light emitting element.

Advantageous Effects of Invention

According to the present invention, in the method for manufacturing a semiconductor light emitting element, it is possible to reduce the emission wavelength distribution σ of the semiconductor light emitting layer obtained in the same substrate by using the compound semiconductor substrate having the amount of warpage H within a range of 50 µm≤H≤250 µm and forming the light emitting layer thereon.

DESCRIPTION OF EMBODIMENTS

An exemplary embodiment of the present invention will be described in detail below. It should be noted that the present invention is not limited to the exemplary embodiment below, but is able to be put into practice with various modifications within a scope of the gist thereof. Moreover, the drawings are used for the purpose of illustrating the exemplary embodiment, and do not intend to represent an actual size.
(Semiconductor Light Emitting Element)

The semiconductor light emitting element manufactured in the exemplary embodiment ordinarily includes a predetermined substrate and a compound semiconductor layer formed on the substrate. As a compound semiconductor constituting the compound semiconductor layer, for example, a group III-V compound semiconductor, a group II-VI compound semiconductor, a group IV-IV compound semiconductor and the like can be provided. In the exemplary embodiment, the group III-V compound semiconductor is preferred, and among others, a group III nitride compound semiconductor is more preferred. Description will be provided below to the semiconductor light emitting layer having the group III nitride compound semiconductor as an example.

FIG. 1 is a diagram illustrating an example of a layer structure of the semiconductor light emitting element manufactured in the exemplary embodiment. As shown in FIG. 1, in a semiconductor light emitting element I, a base layer 130, an n-type semiconductor layer 140, a light emitting layer 150 and a p-type semiconductor layer 160 are laminated in this order on an intermediate layer 120 formed on a substrate 110. It should be noted that the n-type semiconductor layer 140, the light emitting layer 150 and the p-type semiconductor layer 160 are collectively referred to as a compound semiconductor layer (a group III compound semiconductor layer) 200.

Moreover, a transparent anode 170 (refer to FIG. 2) is laminated on the p-type semiconductor layer 160, and an anode bonding pad 180 is formed thereon, and a cathode bonding pad 190 is laminated on an exposed region 143 formed on an n-type contact layer 141 of the n-type semiconductor layer 140.

Here, in the exemplary embodiment, a layer, which contains at least the intermediate layer 120 and at least one layer selected from the base layer 130 composed of the group III compound semiconductor and the n-type semiconductor layer 140 and is formed on the substrate 110, is referred to as a compound semiconductor substrate 100 and is treated as a semiconductor layer lamination substrate without having a light emitting function.

Here, the n-type semiconductor layer 140 formed on the base layer 130 composed of the group III compound semiconductor includes the n-type contact layer 141 and an n-type cladding layer 142. The light emitting layer 150 has a structure in which barrier layers 151 and well layers 152 are alternately laminated. In the p-type semiconductor layer 160, a p-type cladding layer 161 and a p-type contact layer 162 are laminated.

In the exemplary embodiment, the total thickness of a compound semiconductor layer (the group III compound semiconductor layer including the intermediate layer 120, the base layer 130, the n-type semiconductor layer 140, the light emitting layer 150 and the p-type semiconductor layer 160) formed on the substrate 110 is 5 µm or more, preferably 8 µm or more, and more preferably 9 µm or more. Further, the total thickness is 15 µm or less, preferably 14 µm or less, and more preferably 13 µm or less.

If the total thickness of the compound semiconductor layer (the group III compound semiconductor layer) is excessively thin, especially, if the thickness of the base layer 130 and the n-type semiconductor layer 140 is thin, crystallinity of the light emitting layer 150 and the p-type semiconductor layer 160, which are laminated thereafter, is deteriorated, thus causing a tendency to weaken light emitting intensity when the semiconductor light emitting element I is formed.
(Substrate 110)

The substrate 110 is made of a material different from a material of the group III nitride compound semiconductor, and group III nitride semiconductor crystals are epitaxially grown on the substrate 110. As the material constituting the substrate 110, for example, sapphire, carbonized silicon (silicon-carbide: SiC), silicon, zinc oxide, magnesium oxide, manganese oxide, zirconium oxide, manganese-zinc-iron oxide, magnesium-aluminum oxide, zirconium boride, gallium oxide, indium oxide, lithium-gallium oxide, lithium-aluminum oxide, neodium-gallium oxide, lanthanum-strontium-aluminum-tantalum oxide, strontium-titanium oxide, titanium oxide, hafnium, tungsten, molybdenum and the like can be provided. Among these, sapphire and carbonized silicon (silicon-carbide: SiC) are particularly preferred.

Moreover, with respect to the surface of the substrate 110, it is preferable that there is a difference in the surface roughness Ra (arithmetic average roughness) between a surface on which the semiconductor layer is laminated (front surface) and a surface opposite thereto (back surface). Especially, it is more preferable to use a substrate with a relation of the surface roughness Ra in which front surface 5 back surface.
(Intermediate Layer 120)

As described above, in the exemplary embodiment, the substrate 110 is made of a material different from a material of the group III nitride compound semiconductor. Accordingly, when the compound semiconductor layer 200 is formed by an organic metal chemical vapour deposition method (MOCVD) as described later, it is preferable to provide the intermediate layer 120 that performs a buffering function on the substrate 110. Especially, in terms of the buffering function, it is preferable that the intermediate layer 120 has a single crystal structure. In the case where the intermediate layer 120 having the single crystal structure is formed on the substrate 110, the buffering function of the intermediate layer 120 effectively works, and the base layer 130 and the compound semiconductor layer 200 which are formed on the intermediate layer 120 become a crystal film having excellent orientation property and crystallinity.

The intermediate layer 120 preferably contains Al, and in particular, preferably contains AlN which is a group III nitride. As a material constituting the intermediate layer 120, there is no particular limitation on any group III nitride compound semiconductor as long as it is denoted by the general formula of AlGaInN. Further, As or P may be contained as a group V element. In the case where the intermediate layer 120 is made of a composition containing Al, GaAlN is preferable, and the content of Al is preferably 50% or more.
(Base Layer 130)

As a material used for the base layer 130, the group III nitride containing Ga (GaN-based compound semiconductor) is used, and in particular, AlGaN or GaN can be preferably used. The thickness of the base layer 130 is 0.1 µm or more, preferably 0.5 µm or more, and more preferably 1 µm or more.

(N-Type Semiconductor Layer 140)

The n-type semiconductor layer 140 is constituted by the n-type contact layer 141 and the n-type cladding layer 142. As the n-type contact layer 141, similar to the base layer 130, GaN-based compound semiconductor is used. Further, the gallium nitride-based compound semiconductors which constitute the base layer 130 and the n-type contact layer 141 have preferably the identical composition, and the total thickness of these layers is set in a range of 0.1 μm to 20 μm, preferably in a range of 0.5 μm to 15 μm, and more preferably in a range of 1 μm to 12 μm.

The n-type cladding layer 142 is capable of being formed by AlGN, GaN, GaInN, or the like. The hetero junction structure or the superlattice structure in which the layer is laminated plural times of these structures may also be used. When GaInN is employed, the band gap is preferably larger than that of GaInN of the well layer 152 constituting the light emitting layer 150 which will be described later. The thickness of the n-type cladding layer 142 is preferably in a range of 5 nm to 500 nm, and more preferably in a range of 5 nm to 100 nm.

(Light Emitting Layer 150)

In the light emitting layer 150, the barrier layers 151 made of gallium nitride-based compound semiconductor and the well layers 152 made of gallium nitride-based compound semiconductor containing indium are alternately laminated in a repeated manner, and the barrier layers 151 are provided in such an order to face the n-type semiconductor layer 140 and the p-type semiconductor layer 160, respectively. In the light emitting layer 150 in the exemplary embodiment, six barrier layers 151 and five well layers 152 are alternately laminated in a repeated manner, and the barrier layers 151 are arranged as the uppermost and lowermost layers of the light emitting layer 150, and moreover, the light emitting layer 150 is configured to include the well layers 152 arranged between the barrier layers 151.

As the barrier layer 151, a gallium nitride-based compound semiconductor, such as $Al_cGa_{1-c}N$ ($0 \leq c \leq 0.3$), which has a larger band gap energy than that of the well layer 152 made of the gallium nitride-based compound semiconductor containing indium, can be preferably used.

Moreover, for the well layer 152, as the gallium nitride-based compound semiconductor containing indium, a gallium indium nitride such as $Ga_{1-s}In_sN$ ($0<s<0.4$) can be used.

The thickness of the well layer 152 is not particularly limited; however, the thickness by which quantum effects can be obtained, that is, the critical thickness, is preferable. For example, the thickness of the well layer 152 is preferably in a range of 1 nm to 10 nm, and more preferably, in a range of 2 nm to 6 nm.

(P-Type Semiconductor Layer 160)

The p-type semiconductor layer 160 is constituted by the p-type cladding layer 161 and the p-type contact layer 162. As the p-type cladding layer 161, $Al_dGa_{1-d}N$ ($0<d\leq0.4$) is preferable. The thickness of the p-type cladding layer 161 is preferably in a range of 1 nm to 400 nm, and more preferably in a range of 5 nm to 100 nm.

As the p-type contact layer 162, a gallium nitride-based compound semiconductor layer containing at least $Al_eGa_{1-e}N$ ($0\leq e<0.5$) may be provided. The thickness of the p-type contact layer 162 is not particularly limited; however, it is preferably in a range of 10 nm to 500 nm, and more preferably in a range of 50 nm to 200 nm.

(Transparent Anode 170)

As the material constituting the transparent anode 170, conventionally-known materials such as ITO ($In_2O_3$—$SnO_2$), AZO (ZnO—$Al_2O_3$), IZO ($In_2O_3$—ZnO), and GZO (ZnO—$Ga_2O_3$) may be provided. Moreover, the structure of the transparent anode 170 is not particularly limited, and any conventionally-known structures can be employed. The transparent anode 170 may be formed to cover the almost entire surface of the p-type semiconductor layer 160 and may also be formed in a lattice shape or a tree shape.

(Anode Bonding Pad 180)

The anode bonding pad 180, which is an electrode formed on the transparent anode 170, is constituted by conventionally-known materials such as Au, Al, Ni and Cu. The structure of the anode bonding pad 180 is not particularly limited and conventionally-known structures may be employed.

The thickness of the anode bonding pad 180 is in a range of 100 nm to 1,000 nm, and preferably in a range of 300 nm to 500 nm.

(Cathode Bonding Pad 190)

As shown in FIG. 2, in the compound semiconductor layer 200 (the n-type semiconductor layer 140, the light emitting layer 150 and the p-type semiconductor layer 160) formed on the intermediate layer 120 and the base layer 130 which are formed on the substrate 110, the cathode bonding pad 190 is formed to contact the n-type contact layer 141 in the n-type semiconductor layer 140. Therefore, when the cathode bonding pad 190 is formed, a part of each of the p-type semiconductor layer 160, the light emitting layer 150, and the n-type semiconductor layer 140 is removed, the exposed region 143 of the n-type contact layer 141 is formed, and then the cathode bonding pad 190 is formed thereon.

As the material of the cathode bonding pad 190, various materials and structures are widely known, and these widely-known cathodes may be used without any limitation by any well-known method in this technical field.

(Method for Manufacturing Semiconductor Light Emitting Element)

Next, description will be given to a method for manufacturing a semiconductor light emitting element.

FIG. 2 is a diagram illustrating an example of a semiconductor light emitting element obtained by a manufacturing method to which the exemplary embodiment is applied.

In the semiconductor light emitting element I in the exemplary embodiment, on the substrate 110 made of sapphire having a predetermined diameter D and thickness d, the intermediate layer 120 made of group III nitride is formed by activating a metal material and gas containing a group V element with plasma, and reacting them. Subsequently, on the intermediate layer 120 thus formed, the base layer 130 and the compound semiconductor substrate 100 (refer to FIG. 1) having the n-type semiconductor layer 140 are formed (compound semiconductor substrate forming step). Then, on the compound semiconductor substrate 100, the light emitting layer 150 and the p-type semiconductor layer 160 are formed (light emitting layer forming step). Next, the substrate 110 is ground to a predetermined thickness, and thereafter cut into an appropriate size.

In the exemplary embodiment, the diameter D of the substrate 110 to be used is usually selected from a range of 50 mm to 155 mm. Further, the thickness d of the substrate 110 is usually selected from a range of 0.4 mm to 1.5 mm, and preferably from a range of 0.4 mm to 1.2 mm.

On this occasion, in the exemplary embodiment, the amount of warpage H of the substrate 110 to be used is preferably selected from a range of $-30\ \mu m \leq H \leq 30\ \mu m$, $-30\ \mu m \leq H<0$ or $0<H\leq30\ \mu m$, and more preferably, selected from a range of $-10\ \mu m \leq H \leq 10\ \mu m$, $-10\ \mu m \leq H<0$ or $0<H\leq10\ \mu m$.

In the exemplary embodiment, especially, in the case where the diameter D of the substrate 110 is of the order of 50 mm to 51 mm (about 2 inches) or of the order of 100 mm to 102 mm (about 4 inches), it is preferable to select the amount of warpage H of the substrate 110 from a range of −10 µm≤H<0 or 0<H≤10 µm.

Here, the warpage of the substrate 110 is defined as a difference between the maximum value and the minimum value of a distance between a reference surface and a wafer surface when the substrate 110 is placed on the horizontal reference surface. In the present application, measurement of the amount of warpage H of the substrate 110 was performed by measuring a SORT value by a laser grazing incidence interferometer (Flatness Tester FT-17 manufactured by NIDEK Co., Ltd.). Then, in the case where the warpage direction is in a convex state, a plus value was obtained, and in the case of a concave state, a minus value was obtained.

In the exemplary embodiment, when the group III nitride semiconductor crystal is epitaxially grown on the above-described substrate 110, it is preferable to form the intermediate layer 120 on the substrate 110 with a material which has been activated with plasma and reacted by use of a sputtering method. Here, the group V element is nitrogen, a ratio of nitrogen content in a gas when the intermediate layer 120 is formed is set in a range of 50% to 99% or less, and the intermediate layer 120 is formed as a monocrystal structure. Consequently, the intermediate layer 120 having excellent crystallinity can be formed on the substrate 110 as an orientation film having a specific anisotropy in a short time. As a result, it becomes possible to efficiently grow the group III nitride semiconductor having excellent crystallinity on the intermediate layer 120.

In the exemplary embodiment, after forming the intermediate layer 120 by the sputtering method, the base layer 130 and the n-type semiconductor layer 140 are successively formed thereon by the organic metal chemical vapour deposition method (MOCVD) to form the compound semiconductor substrate 100 (compound semiconductor substrate forming step).

Subsequently, on the compound semiconductor substrate 100, the light emitting layer 150 and the p-type semiconductor layer 160 are successively formed by the MOCVD method.

In the exemplary embodiment, in the compound semiconductor substrate forming step, the compound semiconductor substrate 100 obtained by forming at least one compound semiconductor layer as described above is formed so that the amount of warpage H thereof is in a range of 50 µm≤H≤250 µm. Here, the amount of warpage H of the compound semiconductor substrate 100 is preferably in a range of 80 µm≤H≤200 µm, more preferably in a range of 80 µm≤H≤150 µm, and still more preferably in a range of 100 µm≤H≤120 µm.

Here, similar to the description given to the amount of warpage H of the substrate 110, the warpage of the compound semiconductor substrate 100 is defined as a difference between the maximum value and the minimum value of a distance between a reference surface and a surface of the compound semiconductor substrate 100 when the compound semiconductor substrate 100 is placed on the horizontal reference surface. Measurement of the amount of warpage H of the compound semiconductor substrate 100 is performed by measuring a SORI value by the laser grazing incidence interferometer (Flatness Tester FT-17 manufactured by NIDEK Co., Ltd.). Then, in the case where the warpage direction is in a convex state, a plus value was obtained, and in the case of a concave state, a minus value was obtained.

In the exemplary embodiment, owing to the amount of warpage H of the compound semiconductor substrate 100 falling within the aforementioned range, for example, it is possible to make the emission wavelength distribution a of the compound semiconductor layer 200, which is obtained by further forming the light emitting layer 150 and the p-type semiconductor layer 160 successively by the MOCVD method, 6 nm or less.

As the amount of warpage H of the compound semiconductor substrate 100 becomes less than 50 µm, there is a tendency of the emission wavelength distribution σ from the compound semiconductor layer 200 formed thereon to become more than 6 nm.

Further, as the amount of warpage H of the compound semiconductor substrate 100 becomes more than 250 µm, there is a tendency of the emission wavelength distribution a from the compound semiconductor layer 200 formed thereon to become more than 6 nm.

In the MOCVD method, hydrogen ($H_2$) or nitrogen ($N_2$) is used as a carrier gas, trimethylgallium (TMG) or triethylgallium (TEG) is used as a source of Ga which is a group III raw material, trimethylaluminum (TMA) or triethylaluminum (TEA) is used as a source of Al, trimethylindium (TMI) or triethylindium (TEI) is used as a source of In, ammonia ($NH_3$), hydrazine ($N_2H_4$) or the like is used as a source of N which is a group V raw material.

As a dopant, for the n-type, monosilane ($SiH_4$) or disilane ($Si_2H_6$) can be used as a raw material of Si, and organic germanium compounds, such as germane gas ($GeH_4$), tetramethyl germanium (($CH_3$)$_4$Ge), or tetraethyl germanium (($C_2H_5$)$_4$Ge) can be used as a germanium raw material.

It should be noted that the gallium nitride-based compound semiconductor is able to have a configuration containing the group III elements other than Al, Ga, and In, and as necessary, dopant elements such as Ge, Si, Mg, Ca, Zn and Be can be contained. Furthermore, there are some cases where not only the elements which are intentionally added but also impurities which are inevitably contained depending on the layer-forming conditions and the like, or a very small quantity of impurities which are contained in a raw material and a material of a reactor are contained.

It should be noted that, in the compound semiconductor layer, it is allowed to form the base layer 130 by the MOCVD method, thereafter form each of the n-type contact layer 141 and the n-type cladding layer 142 by the sputtering method, subsequently form the light emitting layer 150 thereon by the MOCVD method, and then form each of the p-type cladding layer 161 and the p-type contact layer 162 constituting the p-type semiconductor layer 160 by a reactive sputtering method.

After forming the intermediate layer 120, the base layer 130 and the compound semiconductor layer 200 on the substrate 110 having the above-described diameter D and thickness d, the transparent anode 170 is laminated on the p-type semiconductor layer 160 of the compound semiconductor layer 200, and the anode bonding pad 180 is formed thereon. The wafer is formed in which the cathode bonding pad 190 is further provided on the exposed region 143 formed in the n-type contact layer 141 of the n-type semiconductor layer 140.

After that, the surface-to-be-ground of the substrate 110 is ground and polished to a predetermined thickness. In the exemplary embodiment, the substrate 110 of the wafer is ground by a grinding process for about 20 minutes, and the thickness of the substrate 110 is reduced, for example, from about 900 µm to about 120 µm. Further, in the exemplary embodiment, the substrate 110 is polished so that the thickness thereof is reduced from about 120 µm to about 80 µm by a polishing process for about 15 minutes subsequent to the grinding process.

Next, the wafer, in which the thickness of the substrate 110 has been adjusted, is cut into squares each of which is of 350 μm per side, thus forming the semiconductor light emitting element in which the intermediate layer 120, the base layer 130 and the compound semiconductor layer 200 are formed on the substrate 110.

EXAMPLES

Hereafter, the present invention will be described in further detail based on Examples. However, the present invention is not limited to the following Examples as long as long as a scope of the gist thereof is not exceeded.

Methods for evaluating the amount of warpage H of the sapphire substrate used in the Examples and the distribution of the emission wavelength (emission wavelength distribution a) obtained from the compound semiconductor wafer are as follows.

(1) Amount of Warpage H of Compound Semiconductor Substrate

The amount of warpage H of the compound semiconductor substrate was evaluated based on the SORI value measured by a laser grazing incidence interferometer (Flatness Tester FT-17 manufactured by NIDEK Co., Ltd.). The SORI value was measured in a state where the compound semiconductor substrate was absorbed to a bow chuck of the flatness tester and was inclined by 8 degrees frontward from a vertical position. The range of the measurement excluded 1 mm from the outer periphery of the sapphire substrate (inside value 1 mm).

(2) Amount of Warpage H of Sapphire Substrate

The amount of warpage H of the sapphire substrate is measured by use of a method similar to that of the compound semiconductor substrate.

120 made of AlN with a thickness of 0.05 μm was formed on the substrate 110 by the sputtering method, the base layer 130 made of undoped GaN with a thickness of 8 μm and the n-type contact layer 141 made of Si-doped GaN with a thickness of 2 μm were formed thereon by the organic metal chemical vapour deposition method (MOCVD) to form the compound semiconductor substrate 100, as shown in FIG. 2.

Moreover, on the compound semiconductor substrate 100, the n-type cladding layer 142 made of $In_{0.1}Ga_{0.9}N$ with a thickness of 250 nm was formed by the MOCVD, then the barrier layer 151 made of Si-doped GaN with a thickness of 16 nm and the well layer 152 made of $In_{0.2}Ga_{0.8}N$ with a thickness of 2.5 nm were laminated five times, and finally the barrier layer 151 was provided, thereby forming the light emitting layer 150 having a multiple quantum well structure.

Further, the p-type cladding layer 161 made of Mg-doped $Al_{0.07}Ga_{0.93}N$ with a thickness of 10 nm and the p-type contact layer 162 made of Mg-doped GaN with a thickness of 150 nm were formed in this order.

It should be noted that lamination of the gallium nitride-based compound semiconductor layers was performed by the MOCVD method under normal conditions that are well known in this technical field.

Thereafter, the wavelength distribution σ was measured by the above-described PL mapper (RPM-Σ manufactured by Accent Optical Technologies, Inc.) and the results shown in Table 1 were obtained.

Next, on the p-type contact layer 162 made of GaN, the transparent anode 170 made of IZO with a thickness of 250 nm was formed, and thereafter, with normal conditions that are well known in this technical field, such as forming a protection layer made of $SiO_2$ and the like, the chip used for the light emitting element was manufactured.

TABLE 1

|  | Substrate | | | | Compound semiconductor substrate | Compound semiconductor light emitting layer |
| --- | --- | --- | --- | --- | --- | --- |
| Examples | Substrate diameter D (mm) | Substrate thickness d (mm) | D/d (×10⁻²) | Amount of warpage H (μm) | Amount of warpage H (μm) | Wavelength distribution σ (nm) |
| 1 | 50.8 | 0.42 | 1.21 | −5.2 | 80 | 2.1 |
| 2 | 100 | 0.69 | 1.44 | −6.5 | 225 | 4.8 |
| 3 | 100 | 0.73 | 1.37 | −7.1 | 190 | 3.2 |
| 4 | 100 | 0.91 | 1.10 | −8.7 | 110 | 1.8 |
| 5 | 100 | 0.91 | 1.10 | −5.4 | 113 | 1.8 |
| 6 | 100 | 0.91 | 1.10 | 4.2 | 122 | 2.6 |
| 7 | 100 | 0.91 | 1.10 | 2.3 | 120 | 2.2 |
| 8 | 100 | 0.91 | 1.10 | −7.6 | 85 | >2.5 |
| 9 | 100 | 0.91 | 1.10 | −6.5 | 60 | 5.7 |
| 10 | 150 | 1.10 | 1.36 | −2.4 | 180 | 2.5 |

(3) Distribution of Emission Wavelength (Emission Wavelength Distribution σ) Obtained from Compound Semiconductor Wafer The method for measuring the emission wavelength distribution σ is not limited in the present invention, but it is preferable to measure by using a PL mapper (RPM-Σ manufactured by Accent Optical Technologies, Inc.)

Examples 1 to 10

The compound semiconductor wafer was formed by using the substrate 110 made of sapphire and having the diameter D and the thickness d shown in Table 1, the intermediate layer From the results shown in Table 1, it is learned that the compound semiconductor light emitting layer (Examples 1 to 10) that was prepared by using the compound semiconductor substrate having the amount of warpage H falling within the range of 50 μm≤H≤250 μm shows a good numerical value of the wavelength distribution σ of the emission wavelength, which is 6 nm or less.

REFERENCE SIGNS LIST

Figure 1:
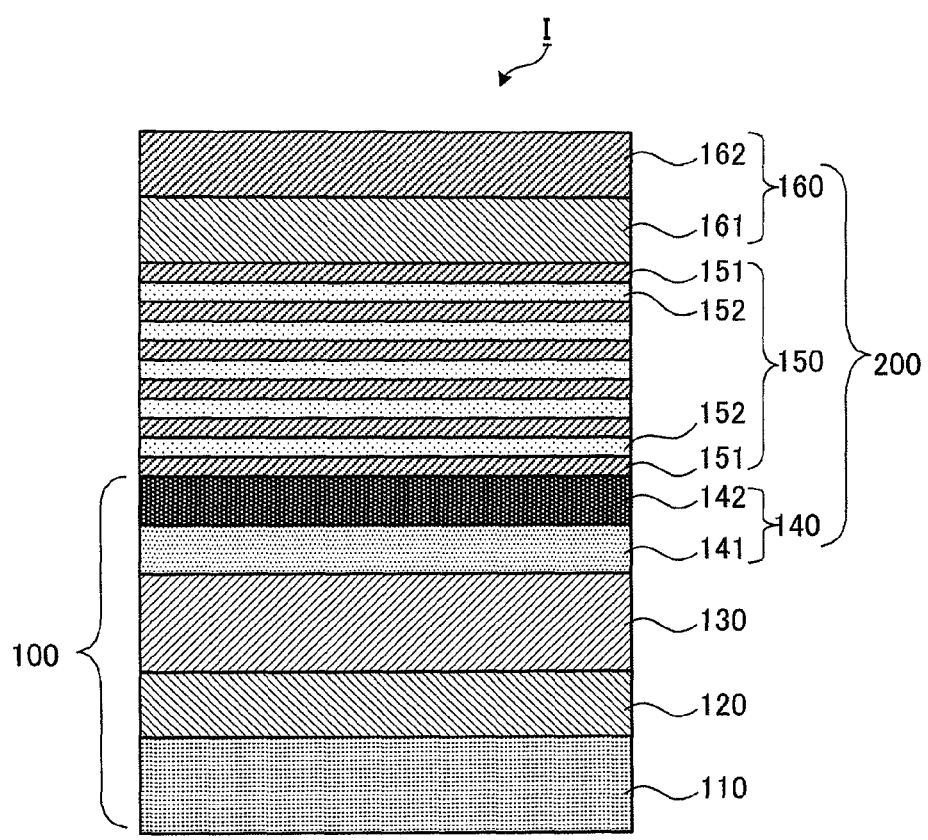
FIG. 1 is a diagram illustrating an example of a layer structure of the semiconductor light emitting element manufactured in the exemplary embodiment.
Figure 2:
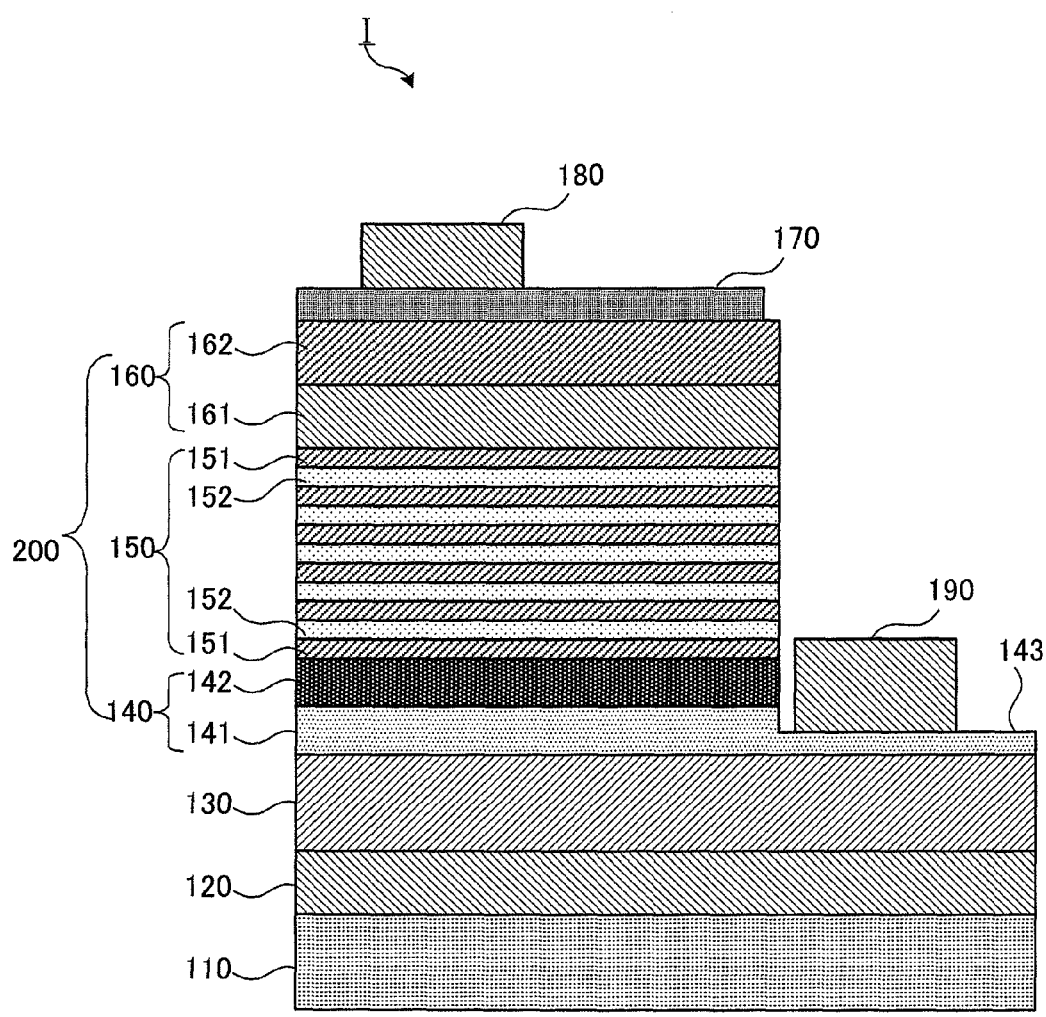
FIG. 2 is a diagram illustrating an example of the semiconductor light emitting element obtained by a manufacturing method to which the exemplary embodiment is applied.

100 Compound semiconductor substrate
110 Substrate
120 Intermediate layer
130 Base layer
140 N-type semiconductor layer
150 Light emitting layer
160 P-type semiconductor layer
170 Transparent anode
180 Anode bonding pad
190 Cathode bonding pad
200 Compound semiconductor layer (group III compound semiconductor layer)
I Semiconductor light emitting element

The invention claimed is:

1. A method for manufacturing a semiconductor light emitting element having a group III compound semiconductor layer, the method comprising:
 a compound semiconductor substrate forming step that forms at least one compound semiconductor layer on a substrate to form a compound semiconductor substrate having an amount of warpage H within a range of 80 µm≤H ≤190 µm; and
 a light emitting layer forming step that forms a light emitting layer composed of a plurality of group III compound semiconductor layers on the compound semiconductor substrate having been formed.

2. The method for manufacturing a semiconductor light emitting element according to claim 1, wherein the group III compound semiconductor layer contains at least a group III nitride.

3. The method for manufacturing a semiconductor light emitting element according to claim 1, wherein the diameter D of the substrate is selected from a range of 50 mm to 155 mm.

4. The method for manufacturing a semiconductor light emitting element according to claim 1, wherein the thickness d of the substrate is selected from a range of 0.4 mm to 1.5 mm.

5. The method for manufacturing a semiconductor light emitting element according to claim 1, wherein an amount of warpage H of the substrate is selected from a range of -10 µm ≤ H ≤10 µm.

6. The method for manufacturing a semiconductor light emitting element according to claim 1, wherein the substrate is made of a material different from a material of a group III compound semiconductor layer.

7. The method for manufacturing a semiconductor light emitting element according to claim 1, wherein the substrate is made of sapphire.

8. The method for manufacturing a semiconductor light emitting element according to claim 1, further comprising an intermediate layer forming step that forms an intermediate layer containing aluminum nitride compound in advance.

9. The method for manufacturing a semiconductor light emitting element according to claim 8, wherein the intermediate layer is formed on the substrate by sputtering.

10. A semiconductor light emitting element manufactured by the method for manufacturing a semiconductor light emitting element according to claim 1.

* * * * *